US008072211B2

(12) United States Patent
Harvey

(10) Patent No.: US 8,072,211 B2
(45) Date of Patent: Dec. 6, 2011

(54) MULTI-CHANNEL MAGNETIC RESONANCE IMAGING AND SPECTROSCOPY

(75) Inventor: Paul Royston Harvey, Eindhoven (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 390 days.

(21) Appl. No.: 12/439,246

(22) PCT Filed: Aug. 29, 2007

(86) PCT No.: PCT/IB2007/053475
§ 371 (c)(1),
(2), (4) Date: Feb. 27, 2009

(87) PCT Pub. No.: WO2008/026174
PCT Pub. Date: Mar. 6, 2008

(65) Prior Publication Data
US 2011/0128000 A1    Jun. 2, 2011

(30) Foreign Application Priority Data
Aug. 30, 2006   (EP) ..................... 06119762

(51) Int. Cl.
*G01V 3/00* (2006.01)
(52) U.S. Cl. ........................ 324/309; 324/307
(58) Field of Classification Search ......... 324/300–322; 600/407–445
See application file for complete search history.

(56) References Cited

U.S. PATENT DOCUMENTS

| | | | |
|---|---|---|---|
| 5,138,260 A | | 8/1992 | Molyneaux et al. |
| 5,779,636 A | * | 7/1998 | Kanazawa ............... 600/410 |
| 6,320,380 B1 | * | 11/2001 | Wu et al. ................. 324/309 |
| 6,961,455 B2 | | 11/2005 | Ma et al. |
| 6,975,114 B1 | * | 12/2005 | Ledden ................... 324/314 |
| 7,109,714 B2 | * | 9/2006 | Rudakov et al. .......... 324/322 |
| 7,375,523 B1 | * | 5/2008 | Hancu .................... 324/307 |
| 7,466,131 B1 | * | 12/2008 | Xu et al. .................. 324/318 |
| 7,642,782 B2 | * | 1/2010 | Vernickel et al. ......... 324/322 |
| 7,800,368 B2 | * | 9/2010 | Vaughan et al. .......... 324/318 |
| 7,852,084 B2 | * | 12/2010 | Zhai et al. ............... 324/318 |
| 2007/0106150 A1 | * | 5/2007 | Greiser et al. ............ 600/413 |

FOREIGN PATENT DOCUMENTS

| | | |
|---|---|---|
| EP | 0487201 A1 | 5/1992 |
| WO | 03107026 A1 | 12/2003 |
| WO | 2004081518 A2 | 9/2004 |
| WO | 2005052622 A1 | 6/2005 |
| WO | 2005088329 A1 | 9/2005 |

OTHER PUBLICATIONS

Anonymous: Outer volume suppression without gradients; 2001; Research Disclosure, Mason Publications; 445(35) 1page.
Kyriakos, W. E., et al.; Generalized encoding through the use of selective excitation in accelerated parallel MRI; 2006; NMR Biomed; 19:379-392.
Zhu, Y.; Parallel Excitation with an array of transmit coils; 2004; MRM; 51:775-784.

* cited by examiner

*Primary Examiner* — Brij Shrivastav

(57) ABSTRACT

A magnetic resonance (MR) system comprising multiple radio-frequency (RP) coils (303) configured to apply an MR pulse sequence (100) including at least a preparation segment (PRP) and an acquisition segment (ACQ), wherein the preparation segment (PRP) and the acquisition segment (ACQ) each comprise one or more excitation pulses, is disclosed herein. The MR system further comprises a first control unit (308) configured to apply the one or more excitation pulses of the preparation segment (PRP) by activating the multiple radio-frequency coils in a first excitation pattern, and a second control unit configured to apply the one or more excitation pulses of the acquisition segment (ACQ) by activating the multiple radio-frequency coils in a second excitation pattern, thereby providing dynamic rf shimming.

19 Claims, 6 Drawing Sheets

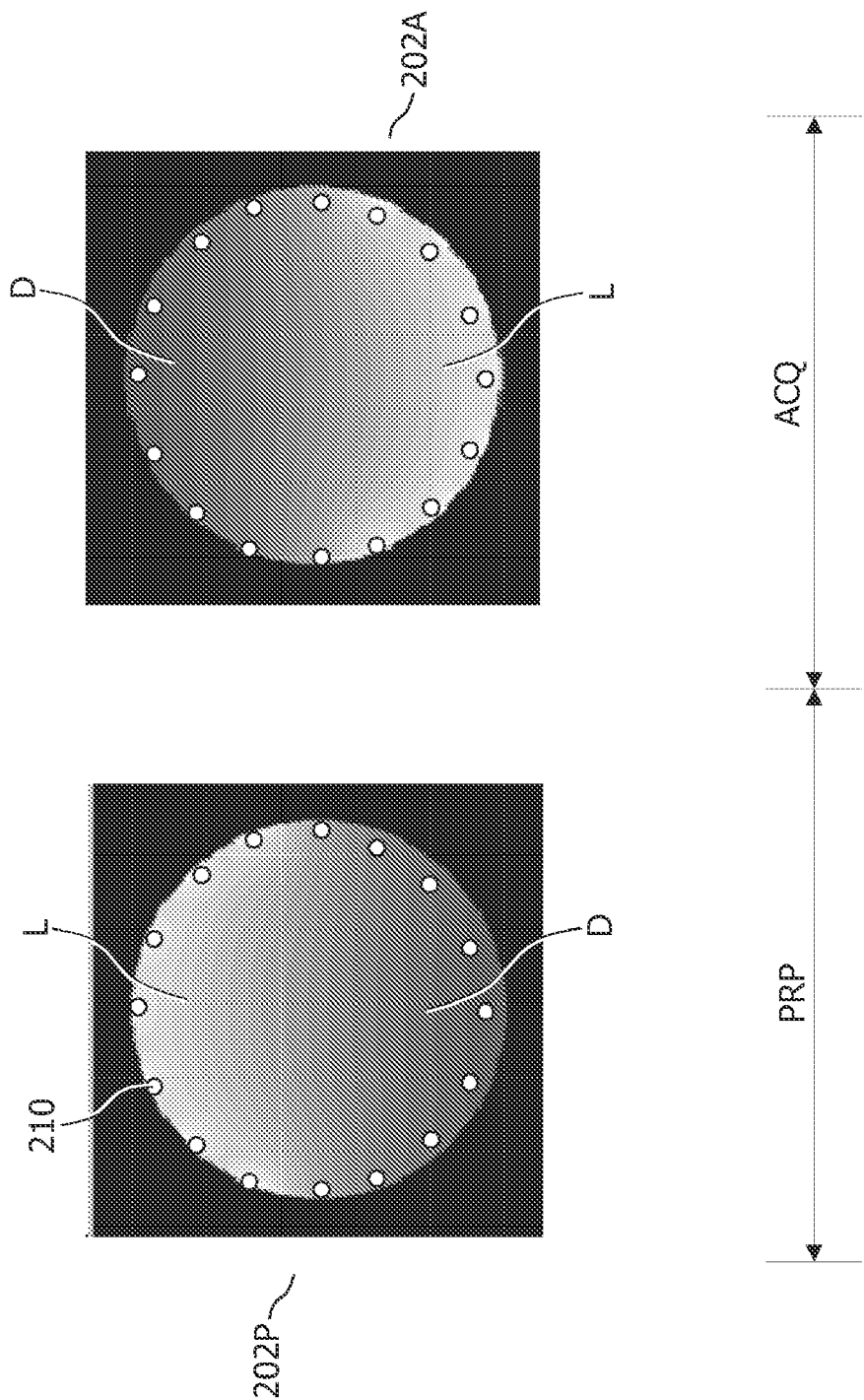

MULTI-CHANNEL MAGNETIC RESONANCE IMAGING AND SPECTROSCOPY

FIELD OF THE INVENTION

This invention relates to magnetic resonance (MR) imaging and spectroscopy, particularly utilizing multiple radio-frequency (RF) coils.

BACKGROUND OF THE INVENTION

U.S. Pat. No. 6,961,455 B1 discusses a fully automated coil selection technique that facilitates image reconstruction with an increased signal-to-noise ratio and reduced artifact presence. Through automatic selection of RF coils from an RF coil array, their invention discriminates between coils in an imaging field-of-view (FOV) based on an index gauge. However, their technique offers only limited possibilities to adjust the excitation uniformity of the RF coil array according to a physiological phase—for example a respiratory phase or a cardiac phase—of the patient. Thus, it is desirable to have an improved method of adjusting the excitation uniformity of an RF coil array in accordance with a physiological phase of the patient. It is also desirable to have an RF coil array with an improved capability of adjusting the coil excitation uniformity according to a physiological phase of the patient. Furthermore, it is also desirable to have an MR system capable of utilizing such an RF coil array, as well as a computer program capable of controlling such an RF coil array.

SUMMARY OF THE INVENTION

Accordingly, an improved method of adjusting the excitation uniformity of an array of RF coils is disclosed herein. Multiple RF coils are configured to apply an MR pulse sequence including at least a preparation segment and an acquisition segment, wherein the preparation segment and the acquisition segment each comprise one or more excitation pulses like RF pulses and gradient pulses. The improved method involves applying the one or more excitation pulses of the preparation segment by activating the multiple radio-frequency coils in a first excitation pattern, and applying the one or more excitation pulses of the acquisition segment by activating the multiple radio-frequency coils in a second excitation pattern.

The uniformity of the excitation profile of an RF coil is affected by both the dielectric properties of a subject being examined using the RF coil, for example a human patient, as well as the frequency of operation of the RF coil itself. At a given frequency of operation of the RF coil, which is determined by the strength of the main magnetic field and the nuclear species being studied, the uniformity of the RF excitation profile inside the body of the subject may be affected by the shape and size of the subject. Non-uniformities so caused in the RF excitation profile can be at least partially compensated for by using the methods disclosed herein, in which each individual RF coil in a group of multiple RF coils is controlled, and configured, independently. This approach to optimizing the RF excitation field is referred to as "RF shimming". In addition, the dielectric-related RF uniformity may also change with time, for example, due to changes in the body's size and shape caused by the subject's respiration during an MR examination. This can be compensated for if the system is configured to dynamically change the RF shimming as a function of the physiological state of the patient. Such an approach to dynamically optimizing the RF excitation field during a pulse sequence is referred to as "dynamic RF shimming". The disclosed method provides this functionality, for example by allowing the multiple RF coils to be configured to use one set of pulse amplitudes, pulse phases and pulse durations for the excitation pulses when the patient is breathing in, and a different set of pulse amplitudes, pulse phases and pulse durations for the excitation pulses when the patient is breathing out.

Furthermore, an MR system comprising multiple RF coils configured to apply an MR pulse sequence according to the disclosed methods is also disclosed herein. The multiple RF coils are configured to apply the MR pulse sequence including at least a preparation segment and an acquisition segment, wherein the preparation segment and the acquisition segment each comprise one or more excitation pulses. The MR system further comprises a first control unit configured to apply the one or more excitation pulses of the preparation segment by activating the multiple RF coils in a first excitation pattern, and a second control unit configured to apply the one or more excitation pulses of the acquisition segment by activating the multiple RF coils in a second excitation pattern.

Furthermore, a computer program for operating multiple RF coils configured to apply an MR pulse sequence according to the disclosed methods is also disclosed herein. The computer program comprises instructions to enable the multiple RF coils to apply the MR pulse sequence including at least a preparation segment and an acquisition segment, wherein the preparation segment and the acquisition segment each comprise one or more excitation pulses. The computer program enables the multiple RF coils to apply the one or more excitation pulses of the preparation segment by activating the multiple RF coils in a first excitation pattern, and to apply the one or more excitation pulses of the acquisition segment by activating the multiple RF coils in a second excitation pattern.

BRIEF DESCRIPTION OF THE DRAWINGS

These and other aspects will be described in detail hereinafter by way of example on the basis of the following embodiments, with reference to the accompanying drawings, wherein:

FIGS. 2a, 2b, 2c and 2d show illustrative implementations of the method disclosed herein.

Corresponding reference numerals used in the various figures represent corresponding elements in the figures.

DETAILED DESCRIPTION OF EMBODIMENTS

Figure 1:
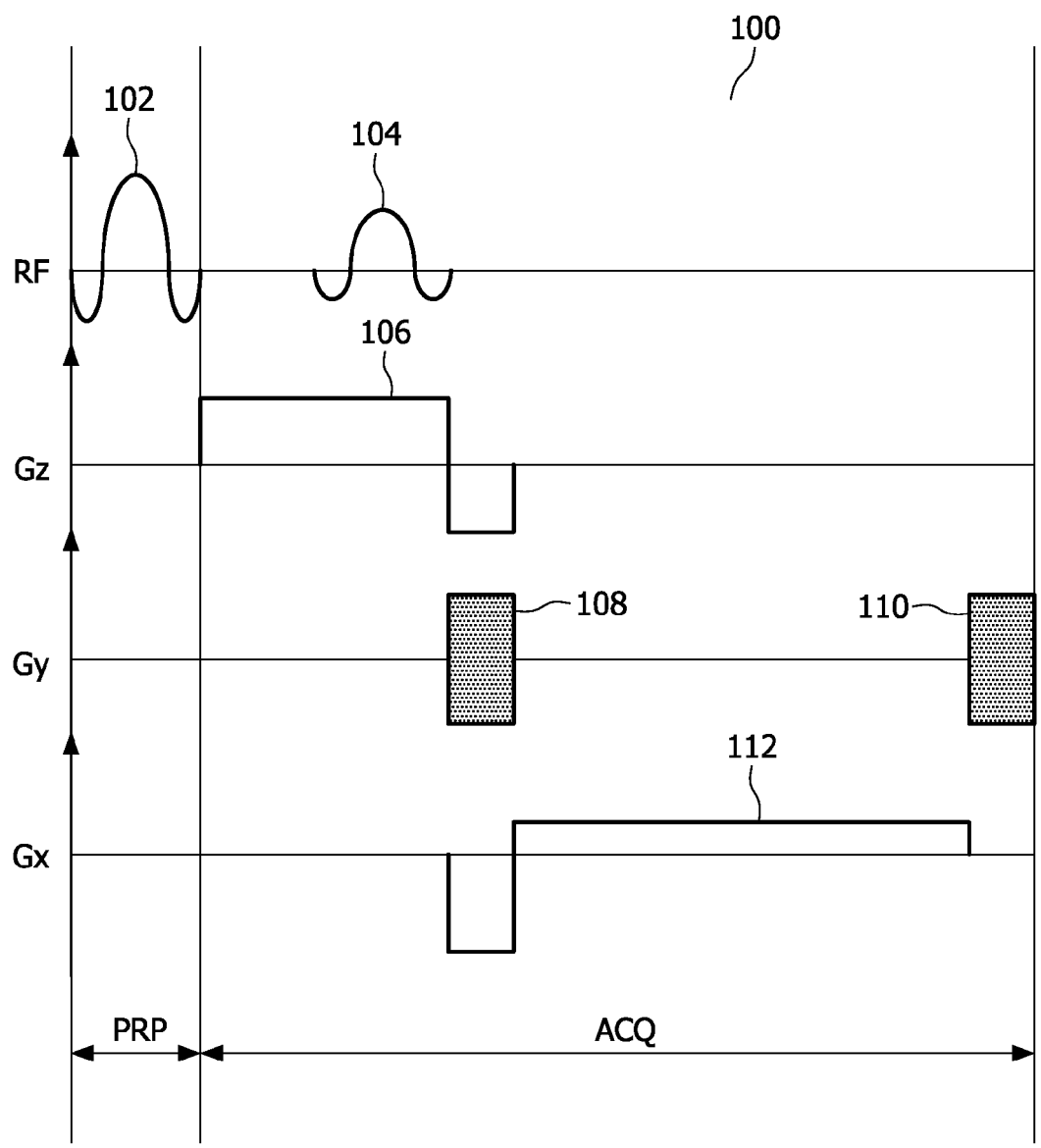
FIG. 1 shows an illustrative MR pulse sequence including a preparation segment and an acquisition segment.

FIG. 1 is a diagrammatic representation of an MR pulse sequence 100, also called a pulse sequence timing diagram, showing the time sequence of application of various pulses. For example, the line labelled RF represents the application of RF pulses 102, 104, while the lines labelled Gz, Gy and Gx represent gradient pulses applied along the z, y and x-directions, respectively. Specifically, the pulse sequence 100 shown in FIG. 1 shows a slice-select gradient 106 being applied along the z-direction, a phase-encoding gradient 108 and a phase-rewinder gradient 110 being applied along the y-direction and a readout gradient 12 being applied along the x-direction. The entire pulse sequence 100 is divided into two segments, a preparation segment PRP and an acquisition segment ACQ. In the particular case shown, the preparation segment PRP comprises only a single RF pulse 102, and the acquisition segment ACQ comprises the imaging sequence consisting of the RF excitation pulse 104 and its associated slice-select gradient 106, phase encoding 108 and phase rewinder gradients 110, and the readout gradient 112.

In certain cases, an MR pulse sequence may be characterized by an initial segment during which the spins are "prepared" for imaging, followed by a subsequent segment during which the prepared spins are imaged. Examples of pulses or sequences of pulses that may be applied during the initial segment include pulses for fat suppression, contrast preparation by applying an inversion recovery pulse, spatial selection or spatial saturation pulses, etc. Examples of pulses or sequences of pulses that may be applied during the subsequent segment include imaging sequences such as spin-echo (SE) sequences, field-echo or gradient echo (FE) pulses, fast field echo (FFE) sequences, turbo spin-echo (TSE) sequences, echo planar imaging (EPI) sequences, etc. The initial segment during which the spins are "prepared" is what is referred to as a "preparation" segment PRP in this document, while the subsequent segment is referred to as an "acquisition" segment ACQ.

Figure 2B:
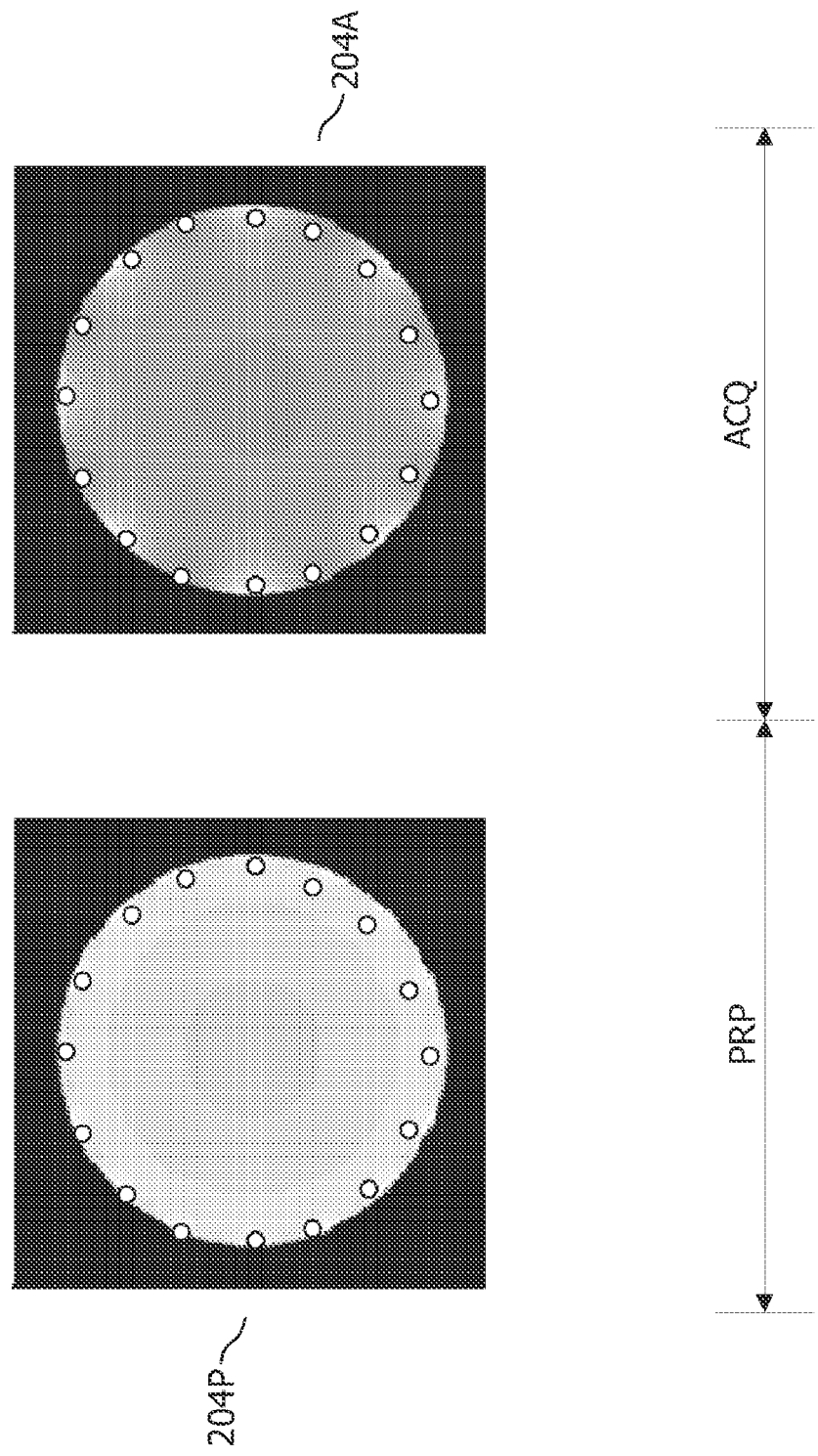
Figure 2C:
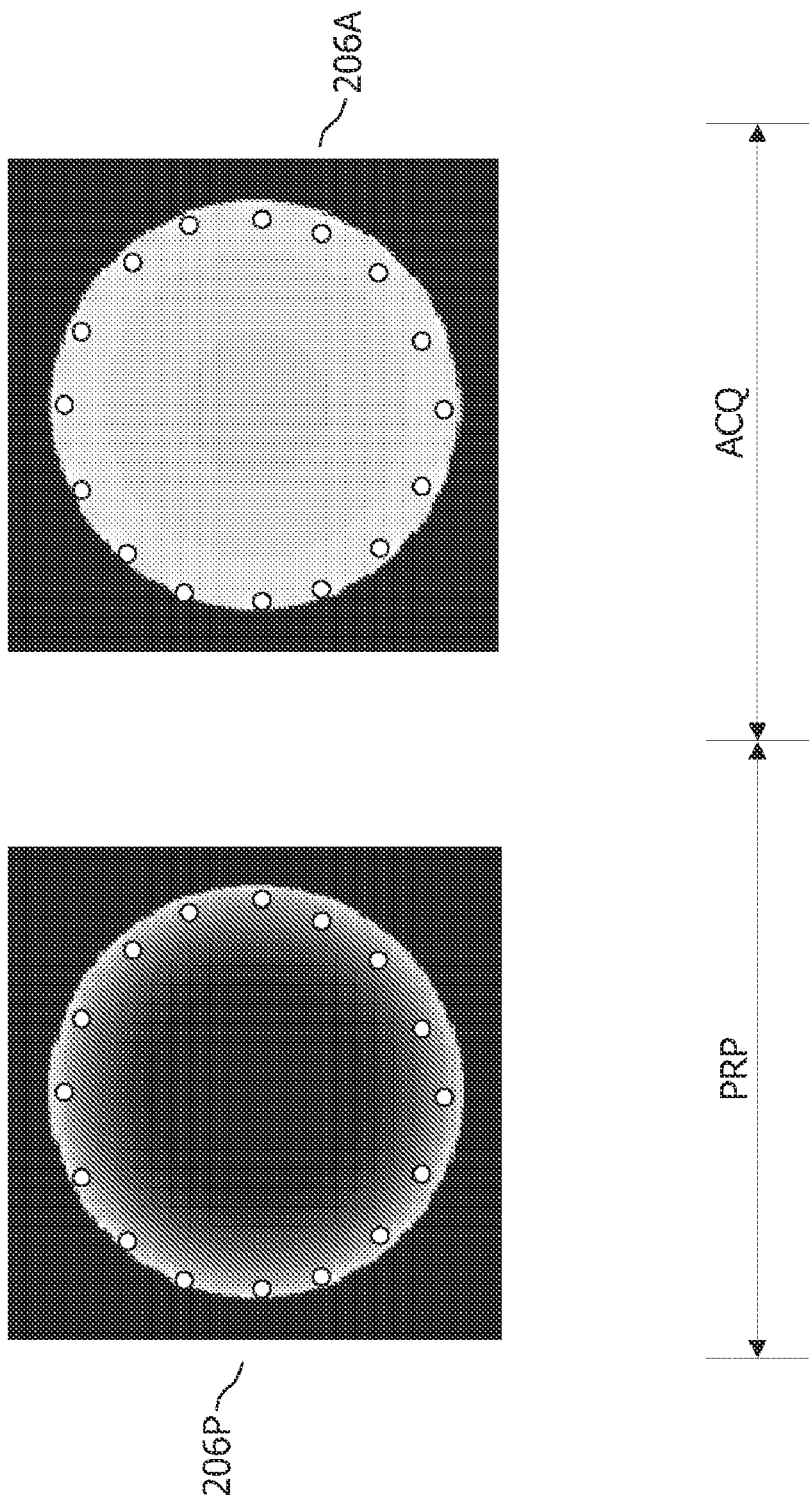

FIGS. 2a, 2b, 2c and 2d illustrate the basic concept of switching configurations of a multi-transmit RF coil array according to the methods disclosed herein. The images 202P, 202A, 204P, 204A, 206P and 206A show a 16-element coil array, wherein the 16 individual elements of the coil array are shown arranged in a circular pattern. Only one of the elements 210 has been labelled in the image 202P for clarity; however, it is to be noted that each similar dot on the images 202P, 202A, 204P, 204A, 206P and 206A represents a separate coil element of the multi-transit RF coil system. Each coil element is cylindrical in structure, and all the cylindrical coil elements are arranged parallel to one another, with the main axes of the cylindrical coil elements extending normal to the plane of the image. In other words, FIGS. 2a, 2b and 2c show the axial cross-section of the multi-transmit RF coil arrangement, wherein the axial plane is defined as a plane that is normal to the longitudinal or main axes of the coil elements. The coil arrangements shown in FIGS. 2a, 2b and 2c may be considered to have a birdcage-like geometry. However, though the geometry is similar to that of a standard birdcage coil, the multi-coil arrangements shown in FIGS. 2a, 2b and 2c differ from a standard birdcage coil in some important aspects.

A standard birdcage coil resonates as a whole. In such a case, the amplitude and phase of the current in a particular rung has a fixed relationship with the amplitude and phase of the current in a different rung. Usually such a coil is tuned so that a standing wave is realized in the coil where the phase of the current in each rung differs by a fixed angle such that the total phase around all rungs is 360 degrees. In this case, the resonant mode of the birdcage coil is referred to as mode 1, i.e., the uniform mode. It is also possible to tune the standard birdcage coil with a different phase relationship between rungs. In this case a different mode of the coil is made to resonate, which mode will not be uniform. A standard birdcage coil, once tuned, cannot be re-configured dynamically. However, if each rung of a birdcage-type coil is made physically independent, tuned to the MR resonant frequency and supplied with its own independent transmit channel, we have a birdcage-type coil capable of transmitting independently over multiple channels. In this case it is possible to supply independently the correct amplitudes and phases, with the correct temporal relationship, to each element so that the mode 1 excitation is synthesized. Since each rung of the coil is now independent and tuned to the MR frequency, it is possible to synthesize any operating mode of the birdcage-type coil by simply choosing the amplitudes and phases of the voltage that is supplied to each element. Additionally, the operating mode of the birdcage-type coil can be changed dynamically during a pulse sequence by changing the amplitudes and phases of the supplied currents.

Drawings 208P and 208A show a planar phased array coil, for example a spine coil or a neurovascular coil, wherein five different loops are arranged in an overlapping fashion to form a phased array coil. The number of loops could, of course, be different from five. The images 202P, 204P, 206P and drawing 208P show the mode of operation of the RF coil array during the preparation segment PRP of the MR pulse sequence, i.e., the first excitation pattern of the RF coils, while the images 202A, 204A, 206A and drawing 208A show the operational mode during the acquisition segment ACQ of the MR pulse sequence, i.e., the second excitation pattern of the RF coils.

FIG. 2a illustrates an embodiment in which spatial saturation and excitation are performed selectively by using different configurations of the multi-element transmit system within the same MR imaging sequence. In this case, as shown in image 202P for the preparation segment PRP, the 16 elements of the multi-transmit RF coil array are energized in a first excitation pattern. During the acquisition segment ACQ, the 16 elements are energized in a second excitation pattern as shown in image 202A. The region within the multiple RF coils that is excited by the excitation pulses applied in the first excitation pattern is shown as a lighter shaded region L, while the region that is relatively less affected or not affected by the excitation pulses of the preparation phase PRP is shown as a darker region D. Such a selection of the region to be excited is possible by selectively setting the pulse parameters of individual pulses that are applied to each of the 16 coils. Some of the pulse parameters that may be manipulated include pulse duration, pulse amplitude and pulse phase. For example, in the embodiment shown in image 202P, the pulse amplitude of all RF excitation pulses being applied during the preparation segment PRP, to the coils that form the bottom half of the birdcage-type geometry, could be set to zero or a very small value so that regions near these coils are not excited by the excitation pulses. This forms the first excitation pattern of energizing the RF coils. During the acquisition segment ACQ, the pulse amplitudes or pulse durations of all pulses applied to the coils that form the top half of the birdcage-like geometry could be reduced to zero or a very small value so that regions near these coils are not excited by the pulses. This forms the second excitation pattern for energizing the RF coils.

As a specific example, a spin-echo pulse sequence that has a preparation segment PRP consisting of an initial RF pulse (e.g., a flip angle of 30°, 45°, 90°, etc.) may use one excitation pattern of the multi-transmit RF coils to limit excitation to a particular region. The spin-echo pulse sequence that also has an acquisition segment ACQ consisting of a refocusing pulse (i.e., a flip angle of 180°) may then switch to a different excitation pattern of the multi-transmit RF coils to limit refocusing to a different region. Thus, the slice selection of the refocusing RF pulse may be made to differ in spatial extent compared to the initial RF pulse. The refocusing pulse will therefore cover a different region compared to the initial RF pulse, and refocus MR signal only from the intersection of the two different regions. A common scheme is to apply the initial and the refocusing pulses orthogonal to each other, though other angles may also be considered. Compared to a technique that uses manipulations of the slice-select gradients to achieve this, the method disclosed herein results in lower acoustic noise.

An advantage of operating a coil as disclosed herein is that it offers the possibility of tailoring the RF excitation to a region of interest during each segment of an MR pulse sequence. For example, in FIG. 2a, let us assume that a patient is placed supine within the volume formed by the multiple RF coils, with the thoracic region being the region to be imaged. In this position, most of the motion of the thorax due to respiration occurs in the top half of the thorax. Therefore, in order to obtain adequate motion suppression, it may be sufficient to saturate the spins towards the anterior part of the thorax during the preparation segment PRP of the RF pulse sequence. During the acquisition segment ACQ, only the posterior part of the thorax is subjected to RF excitation pulses, and MR data are collected only from the excited posterior thoracic region. This reduces the exposure of the patient to RF energy compared to a situation wherein the entire thoracic region is subjected to RF excitation in order to suppress respiratory motion.

FIG. 2b shows a first excitation pattern 204P and a second excitation pattern 204A of activating the RF coil array, wherein all 16 elements of the RF coil array are used for transmission during the preparation segment PRP to ensure a uniform excitation field within the volume formed by the RF coils (image 204P). During the acquisition segment ACQ, the requirement for uniform excitation may be lower and thus it may be adequate to use the second excitation pattern wherein only 8 elements of the multi-transmit RF coil array are effectively activated. The reduced number of active elements during the acquisition segment ACQ results in a corresponding reduction in SAR for a subject under examination. The greater uniformity of excitation achieved during the preparation segment PRP is indicated by the overall excitation profile of the coil array shown in image 204P, which has fewer grayscale values compared to the overall excitation profile of the coil array during the acquisition segment ACQ, shown in image 204A.

As a specific example, a fat suppression pre-pulse may utilize a pre-determined "RF-shimming" or homogeneity correction, which is realized through a highly uniform fat suppression pulse during the preparation segment PRP. The subsequent imaging sequence during the acquisition segment ACQ utilizes a less uniform transmit mode because the method is less sensitive to RF non-uniformity. The possibility of adjusting the RF excitation uniformity according to the physiological response/phase of the patient, i.e., "dynamic RF shimming", is especially helpful at high magnetic field strengths (e.g., 3T and above) wherein dielectric-induced uniformity effects may change as a result of patient motion such as respiratory motion or cardiac motion.

FIG. 2c illustrates an embodiment in which outer volume suppression is performed without the use of gradients by using different configurations of the multi-channel RF transmit system during the preparation segment PRP and the acquisition segment ACQ. For example, a preparatory RF excitation pulse for outer-volume suppression, applied during the preparation segment PRP, utilizes a non-uniform excitation mode of the multi-channel RF transmit system as shown by image 206P, while the subsequent imaging RF excitation pulses, applied during the acquisition segment ACQ, utilize a more uniform excitation mode as shown by image 206A. Specifically, all coil elements in the birdcage-type coil arrangement of FIG. 2c are activated during the preparation segment PRP, but the phases of the currents supplied to the different coil elements are adjusted individually such that the overall excitation profile conforms to a "mode 7" resonance of a standard birdcage coil. During the acquisition segment ACQ, all the coil elements are again activated; however, the phases of the currents supplied to the different coil elements is adjusted individually such that the overall excitation profile now conforms to the "mode 1" or uniform-excitation mode of a standard birdcage coil. The advantage of this approach may be recognized in a reduced need for gradient switching during the selection pulse applied during the preparation segment PRP, resulting in lower acoustic noise.

Figure 2D:
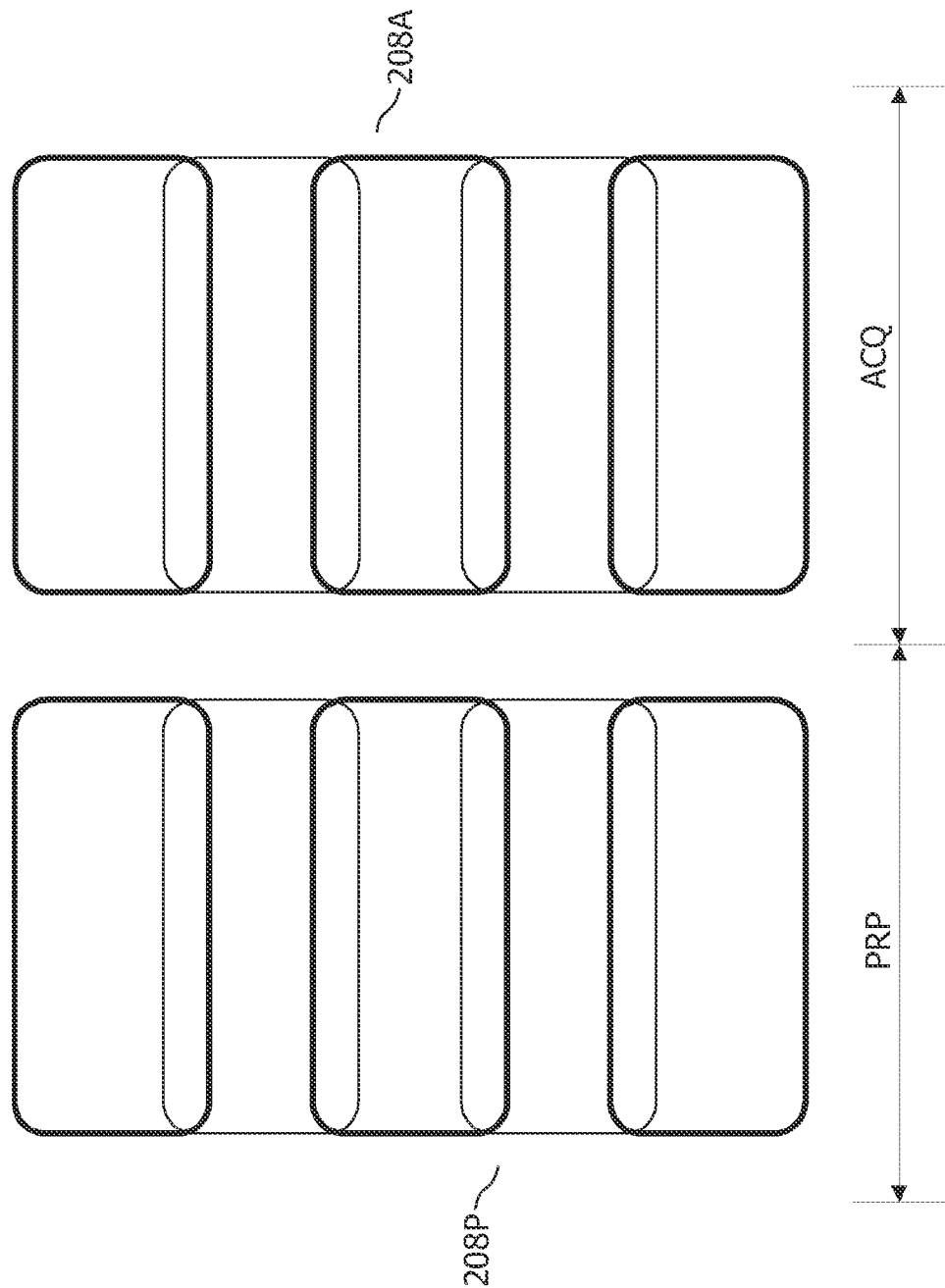

Though only a birdcage-type geometry has been discussed in detail in the above examples, other geometries are equally valid. For example, the method disclosed herein may be implemented using a planar phased-array type multi-transmit RF coil, as shown in FIG. 2d, which shows a phased array coil formed by five overlapping RF loop coils. Each loop is an independent coil with its own transmit channel, and the currents supplied to each of the five loops can be controlled individually and independently of the other loops. During the preparation segment PRP of the MR pulse sequence, all the RF loops are activated in a first excitation pattern. This helps in achieving a very homogeneous excitation of the entire field-of-view covered by the phased-array type coil. During the acquisition segment ACQ, however, the RF loops are activated in a second excitation pattern which has a less homogeneous excitation profile. Thus, unnecessary exposure of tissue to RF irradiation is reduced during the acquisition segment ACQ of the pulse sequence.

It may be noted that in some of the embodiments above, the method can be alternately implemented by selecting different sets of RF coils during the preparation segment PRP and the acquisition segment ACQ. This is particularly applicable to the embodiments shown in FIG. 2a and FIG. 2b. In FIG. 2a, a first set of RF coils, consisting of only the coil elements that are towards the top half of the RF coil arrangement are selected for transmission, while the coil elements in the bottom half are turned off. The resulting excitation profile is shown in image 202P, with the lighter portion on the top half L denoting regions excited by the excitation pulses, and the bottom darker half D denoting regions that are excited relatively less or not at all, by the RF excitation pulses. A saturation pulse or series of saturation pulses delivered in this mode serves to saturate the signal from the spins near the top half of the RF coil. During the acquisition segment ACQ, RF excitation pulses are applied using a second set of RF coils consisting of only the bottom elements of the RF coil arrangement, as shown in image 202A. Similarly, in FIG. 2b, images 204P and 204A show different sets of coil elements being used during the preparation phase PRP and the acquisition phase ACQ. For instance, image 204P shows a first set of RF coils being used during the preparation phase PRP, wherein the first set includes all the 16 coil elements. On the other hand, image 204A shows a second set of coils being active during the acquisition segment ACQ, wherein only alternate coil elements are active, and alternate coil elements are turned off.

Though only a single preparation segment PRP and a single acquisition segment ACQ are shown in FIG. 1, it may be noted that more than one preparation segment PRP and/or acquisition segment ACQ may be present in a particular pulse sequence. It may be noted that in a pulse sequence that has multiple preparation segments PRP or acquisition segments ACQ, the RF coil array may be used in different excitation patterns during different preparation or acquisition segments.

Figure 3:
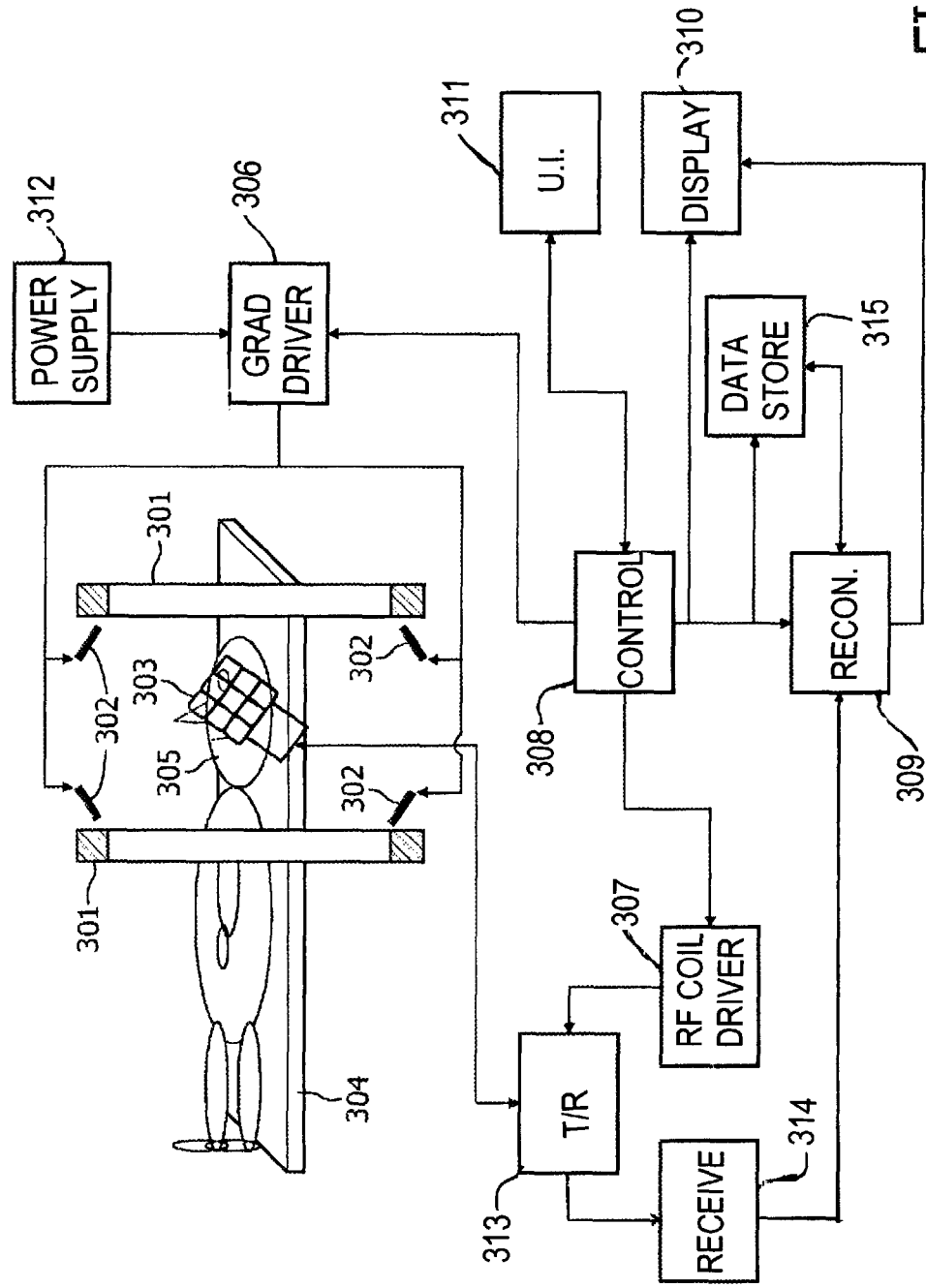
FIG. 3 schematically shows an MR system utilizing an embodiment of the multiple RF coils disclosed herein.

FIG. 3 shows a possible embodiment of an MR system utilizing the multiple RF coils disclosed herein. The MR system comprises a set of main coils 301, multiple gradient coils 302 connected to a gradient driver unit 306, and multiple RF coils 303 connected to an RF coil driver unit 307. The function of the RF coils 303, which may be integrated into the magnet in the form of a body coil, or may be separate surface coils, is further controlled by one or more transmit/receive (T/R) switches 313. The multiple gradient coils 302 and the RF coils are powered by a power supply unit 312. A transport system 304, for example a patient table, is used to position a subject 305, for example a patient, within an examination region of the MR system. A control unit 308 controls the RF coils 303 and the gradient coils 302. The control unit 308 further controls the operation of a reconstruction unit 309. The control unit 308 also controls a display unit 310, for example a monitor screen or a projector, a data storage unit 315, and a user input interface unit 311, for example, a keyboard, a mouse, a trackball, etc.

The main coils 301 generate a steady and uniform static magnetic field, for example, of field strength 1T, 1.5T or 3T. The disclosed multi-transmit RF coils and the method of their operation as disclosed herein are applicable to other field strengths as well. The main coils 301 are arranged in such a way that they typically enclose a tunnel-shaped examination space, into which the subject 305 may be introduced. Another common configuration comprises opposing pole faces with an air gap in between them into which the subject 305 may be introduced by using the transport system 304. To enable MR imaging, temporally variable magnetic field gradients superimposed on the static magnetic field are generated by the multiple gradient coils 302 in response to currents supplied by the gradient driver unit 306. The power supply unit 312, fitted with electronic gradient amplification circuits, supplies currents to the multiple gradient coils 302, as a result of which gradient pulses (also called gradient pulse waveforms) are generated. The control unit 308 controls the characteristics of the currents, notably their strengths, durations and directions, flowing through the gradient coils to create the appropriate gradient waveforms. The RF coils 303 generate RF excitation pulses in the subject 305 and receive MR signals generated by the subject 305 in response to the RF excitation pulses. The RF coil driver unit 307 supplies current to the RF coil 303 to transmit the RF excitation pulse, and amplifies the MR signals received by the RF coils 303. The transmitting and receiving functions of the RF coils 303 are controlled by the control unit 308 via the one or more T/R switches 313. The T/R switch 313 is provided with electronic circuitry that switches the RF coils 303 between transmit and receive modes, and protects the RF coil 303 and other associated electronic circuitry against breakthrough or other overloads, etc. The characteristics of the transmitted RF excitation pulses, notably their strength and duration, are controlled by the control unit 308. The control unit 308 also controls the operational modes of the RF coil array 303, and switches the modes during or within a pulse sequence, as discussed in the methods disclosed herein.

It is to be noted that though the transmitting and receiving coil are shown as one unit in this embodiment, it is also possible to have separate coils for transmission and reception, respectively. It is further possible to have multiple RF coil arrays 303 for transmitting or receiving or both. The RF coil arrays 303 may be integrated into the magnet in the form of a body coil, or may be separate surface coil arrays. They may have different geometries, for example, a birdcage configuration or a simple loop configuration, etc. The multiple RF coils may be connected to independent transmit/receive channels.

The control unit 308 is preferably in the form of a computer that includes a processor, for example a microprocessor. The control unit 308 controls the switching between various modes of the multiple RF coils 303. The control unit 308 may exercise this control by running a computer program that contains instructions to activate the multiple RF coils in a first excitation pattern in order to apply the one or more excitation pulses of the preparation segment (PRP). The computer program also contains further instructions to enable the control unit 308 to activate the multiple RF coils in a second excitation pattern in order to apply the one or more excitation pulses of the acquisition segment (ACQ). In a specific embodiment, the computer program contains instructions to operate a first set of RF coils from the RF coil array 303 during the preparation segment (PRP in FIG. 1) of an MR pulse sequence, and to operate a second set of RF coils from the RF coil array 303 during the acquisition segment (ACQ in FIG. 1) of the MR pulse sequence. The computer program also contains instructions to ensure that the first set and second set of RF coils selected from the RF coil array 303 are not identical. The computer program may also contain instructions to detune the second set of RF coils when the first set of RF coils is in operation during the preparation segment PRP, and to detune the first set of RF coils when the second set of RF coils is in operation during the acquisition segment ACQ. User input interface devices 311 like a keyboard, mouse, touch-sensitive screen, trackball, etc., enable an operator to interact with the MR system.

The MR signal received with the RF coils 303 and a receiver 314 contains the actual information concerning the local spin densities in a region of interest of the subject 305 being imaged. The received signals are reconstructed by the reconstruction unit 309, and displayed on the display unit 310 as an MR image or an MR spectrum. It is alternatively possible to store the signal from the reconstruction unit 309 in a storage unit 315, while awaiting further processing. The reconstruction unit 309 is constructed advantageously as a digital image-processing unit that is programmed to derive the MR signals received from the RF coils 303.

The selection of the first or the second excitation pattern for the RF coils may be made based on a parameter of the pulse sequence, for example a phase encoding gradient or a slice select gradient, etc. For example, in the case of a single-shot echo-planar-imaging sequence, the first occurrence of a phase encoding gradient blip may be used as the demarcation point between the preparation segment PRP (prior to the first phase encoding gradient blip), and the acquisition segment ACQ (after the first phase encoding gradient blip). Thus, the RF coils are activated in a first excitation pattern for all pulses before the first phase encoding gradient blip, and in a second excitation pattern after the first phase encoding gradient blip.

In a possible embodiment, the control unit 308 is programmed to first select the first set of RF coils during the preparation segment PRP. As soon as the slice-encoding gradient is played out or applied along the z-gradient, the control unit 308 automatically deselects the first set of RF coils and selects the second set of RF coils. In other embodiments, the control unit 308 is also configured to detune the second set of RF coils when the first set of RF coils is in operation during the preparation segment PRP, and to detune the first set of RF coils when the second set of RF coils is in operation during the acquisition segment ACQ. Though only one control unit 308 is shown in FIG. 3, it may be noted that multiple control units may exist, as separate pieces of hardware, which, operating together, implement the various functionalities of the control unit 308 as described above. Alternatively, the various functions of the control unit may be implemented in software.

The selection of the first or the second excitation pattern for the RF coils may alternatively be made based on a physiological phase of the subject under examination, for example a respiratory motion or a cardiac motion. For example, the control unit 308 could be configured to apply a certain set of preparatory pulses during the inspiration phase of the respiratory cycle of a human subject being examined in the MR system. This could be termed, for example, as the preparation segment PRP of the pulse sequence, during which the control unit 308 automatically selects a first excitation pattern to apply the preparatory pulses using the RF coils. The control unit is configured to automatically apply the excitation pulses of the acquisition segment ACQ during a second phase of the respiratory cycle, for example the end-expiratory phase. For example, during this period which has the minimum motion of the subject, the control unit 308 could apply an imaging sequence to collect an image of the area of interest. Methods of detecting respiratory or other physiological motion, and synchronizing an MR pulse sequence to certain characteristics or phases of the detected motion is known in the art.

The physiological phase need not be related to a physical motion of the subject. For example, the selection of the first or the second excitation patterns may be made based on neuronal activation patterns in the subject's brain. For example, a functional MR imaging (fMRI) sequence may be used to image neuronal activity in the brain. If a certain pattern of activation is detected, then a separate spectroscopic sequence could be applied in a first excitation pattern to collect MR spectroscopic data from a region of interest. This would be the preparation segment PRP of the entire pulse sequence. If the desired pattern of neuronal activation is not detected in the fMRI image, then a high-resolution imaging sequence could be initiated to collect a high-resolution image of the region of interest. The spectroscopic data could later be superimposed on the high-resolution image of the region of interest to correlate the two data sets. In this embodiment, it may be noted that the entire pulse sequence comprises an fMRI pulse sequence, a spectroscopic sequence and a high-resolution imaging sequence. However, the preparation segment PRP and the acquisition segment ACQ consist only of the spectroscopic sequence and the high-resolution imaging sequence, respectively; the fMRI pulse sequence is not included in either of the segments. Thus, though in certain embodiments, all the excitation pulses used in a scan may be categorized into either the preparation segment PRP or the acquisition segment ACQ, it may not be the case in certain other embodiments.

Another example of a physiological phase that is not related to a motion of the subject is the concentration of contrast agent in the subject's bloodstream, after the subject has been injected with a bolus of MR contrast agent. A region of the subject could be continuously monitored for appearance of the contrast agent, using a fast gradient echo imaging sequence. When the presence of contrast agent is detected above a desired threshold, which could manifest as a rise in signal intensity from the region of interest, a specific pulse sequence to image the vasculature at the region of interest, for example a fluid-attenuated inversion recovery (FLAIR) sequence, could be initiated. The entire pulse sequence could be considered to consist of two separate sequences, namely the fast gradient echo imaging sequence and the FLAIR sequence, with the fast gradient echo imaging sequence forming the preparation segment PRP of the entire pulse sequence and the FLAIR sequence making up the acquisition segment ACQ of the entire pulse sequence. Consequently, the fast gradient echo imaging sequence is applied in a first excitation pattern to the multi-transmit RF coil array, while the FLAIR sequence is applied in a second excitation pattern to the multi-transmit RF coil array.

As discussed above, the method disclosed herein involves utilizing different modes of operation of existing multi-channel hardware for different segments of an MR pulse sequence, and may be implemented on an MR system equipped with multi-channel RF transmit functionality. Each RF coil could be associated with a separate transmit and/or receive channel. A particular transmit/receive channel could also multiplex among multiple RF coils.

The computer program disclosed herein may reside on a computer readable medium, for example a CD-ROM, a DVD, a floppy disk, a memory stick, a magnetic tape, or any other tangible medium that is readable by a computer. The computer program may also be a downloadable program that is downloaded, or otherwise transferred to the computer, for example via the Internet. The computer program may be transferred to the computer via a transfer means such as an optical drive, a magnetic tape drive, a floppy drive, a USB or other computer port, an Ethernet port, etc.

The order in the described implementations of the disclosed methods is not mandatory. A person skilled in the art may change the order of steps or perform steps concurrently using threading models, multi-processor systems or multiple processes without departing from the disclosed concepts.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A magnetic resonance system comprising multiple radio-frequency coils configured to apply a magnetic resonance pulse sequence including at least a preparation segment and an acquisition segment, wherein the preparation segment and the acquisition segment each comprise one or more excitation pulses, the magnetic resonance system further comprising:
   a first control unit configured to apply the one or more excitation pulses of the preparation segment by activating the multiple radio-frequency coils in a first excitation pattern;
   a second control unit configured to apply the one or more excitation pulses of the acquisition segment by activating the multiple radio-frequency coils in a second excitation pattern;
   a third control unit, wherein the third control unit is configured to activate a first set of radio-frequency coils from the multiple radio-frequency coils during the preparation segment, and to activate a second set of radio-frequency coils from the multiple radio-frequency coils during the acquisition segment, and wherein the third control unit is further configured to include at least one radio-frequency coil from the multiple radio-frequency coils in either only the first set or only the second set of radio-frequency coils.

2. The magnetic resonance system of claim 1 including a fourth control unit, wherein the fourth control unit is configured to detune the first set of radio-frequency coils when the second set of radio-frequency coils is activated, and to detune the second set of radio-frequency coils when the first set of radio-frequency coils is activated.

3. A method of operating multiple radio-frequency coils configured to apply a magnetic resonance pulse sequence including at least a preparation segment and an acquisition segment, wherein the preparation segment and the acquisition segment each comprise one or more excitation pulses, the method comprising:

applying the one or more excitation pulses of the preparation segment by activating the multiple radio-frequency coils in a first excitation pattern, the preparation segment including pulses for at least one of fat suppression, contrast preparation, spatial selection, and spatial saturation; and applying the one or more excitation pulses of the acquisition segment by activating the multiple radio-frequency coils in a second excitation pattern.

4. The method of claim 3, wherein applying the one or more excitation pulses of the preparation segment by activating the multiple radio-frequency coils in the first excitation pattern includes setting a first set of pulse parameters for the one or more excitation pulses of the preparation segment, the first set of pulse parameters being selected from a group including at least a pulse amplitude, a pulse phase and a pulse duration.

5. The method of claim 3, wherein the one or more excitation pulses of at least one of the preparation phase and the acquisition phase are applied based on one or more parameters of the magnetic resonance pulse sequence.

6. The method of claim 5, wherein the one or more parameters of the magnetic resonance pulse sequence includes an index of a phase encoding gradient pulse.

7. The method of claim 3, wherein applying the one or more excitation pulses of the acquisition segment by activating the multiple radio-frequency coils in the second excitation pattern includes setting a second set of pulse parameters for the one or more excitation pulses of the acquisition segment, the second set of pulse parameters being selected from a group including at least a pulse amplitude, a pulse phase and a pulse duration.

8. A non-transitory computer readable medium carrying software which controls one or more processors to perform them method of claim 3.

9. The method of claim 3, wherein the one or more excitation pulses of at least one of the preparation phase and the acquisition phase are applied based on a physiological phase of a subject under examination.

10. The method of claim 9, wherein the physiological phase of the subject under examination is a phase of the subject's respiratory motion.

11. The method of claim 9, wherein the physiological phase of the subject under examination is a phase of the subject's cardiac motion.

12. The method of claim 9, wherein the physiological phase of the subject under examination is determined based on a concentration of a magnetic resonance contrast agent in the subject's bloodstream.

13. The method of claim 9, wherein the physiological phase of the subject under examination is determined based on a pattern of neuronal activity in the subject's brain.

14. A method of operating multiple radio-frequency coils configured to apply a magnetic resonance pulse sequence at least a preparation segment and an acquisition segment wherein the preparation segment and the acquisition segment each comprise one or more excitation pulses, the method comprising:

applying one or more excitation pulses of the preparation segment by activating a first set of radio-frequency coils from the multiple radio-frequency coils during the preparation segment; and applying the one or more excitation pulses of the acquisition segment by activating a second set of radio-frequency coils from the multiple radio-frequency coils during the acquisition segment, wherein at least one radio-frequency coil from the multiple radio-frequency coils is included in either only the first set or the second set of radio-frequency coils.

15. The method of claim 14, wherein the one or more excitation pulses of at least one of the preparation phase and the acquisition phase are applied based on one or more parameters of the magnetic resonance pulse sequence.

16. The method of claim 14, wherein the one or more excitation pulses of at least one of the preparation phase and the acquisition phase are applied based on a physiological phase of a subject under examination.

17. A non-transitory computer readable medium carrying software which tonrols one or more processors to perform the method of claim 14.

18. A magnetic resonance system comprising:
a multi-transmit coil system including a plurality of independent individual coil elements disposed adjacent an imaging region;
an RF coil driver which drives the coil elements independently to define a plurality of independent drive channels;
a controller which controls the RF coil driver and the multi-transmit coil system to:
apply one or more excitation pulses of a preparation segment in a first excitation pattern to prepare spins for imaging;
apply a plurality of acquisition segments following each preparation sequence, including at least one excitation pulse with a different excitation pattern than the first excitation pattern.

19. The system of claim 18, wherein the acquisition segments include at least one of spin echo sequences, field echo sequences, fast field echo sequences, turbo spin-echo sequences, and echo planar imaging sequences.

* * * * *